(12) United States Patent
Schulz-Harder

(10) Patent No.: US 6,638,592 B1
(45) Date of Patent: Oct. 28, 2003

(54) CERAMIC/METAL SUBSTRATE, ESPECIALLY COMPOSITE SUBSTRATE

(76) Inventor: Jurgen Schulz-Harder, Hugo-Dietz-Strasse 32, D-91207 Lauf (DE)

( * ) Notice: Subject to any disclaimer, the term of this patent is extended or adjusted under 35 U.S.C. 154(b) by 214 days.

(21) Appl. No.: 09/589,149

(22) Filed: Jun. 8, 2000

(30) Foreign Application Priority Data

Jun. 14, 1999 (DE) .......................................... 199 27 046

(51) Int. Cl.⁷ .............................................. B65D 65/28
(52) U.S. Cl. ........................................ 428/43; 428/156
(58) Field of Search .......................... 428/43, 156, 172, 428/901, 137; 174/250–268

(56) References Cited

U.S. PATENT DOCUMENTS

| | | | | |
|---|---|---|---|---|
| 5,508,089 A | * | 4/1996 | Schulz-Harder | 428/209 |
| 5,770,290 A | * | 6/1998 | Mc Henry et al. | 428/43 |
| 5,773,764 A | * | 6/1998 | Von Vajna | 174/250 |

* cited by examiner

*Primary Examiner*—Harold Pyon
*Assistant Examiner*—Jane Rhee
(74) *Attorney, Agent, or Firm*—Hoffman Wasson & Gitler, PC

(57) ABSTRACT

The invention relates to a novel ceramic/metal substrate, especially to a multiple substrate with a ceramic plate or ceramic layer.

25 Claims, 8 Drawing Sheets

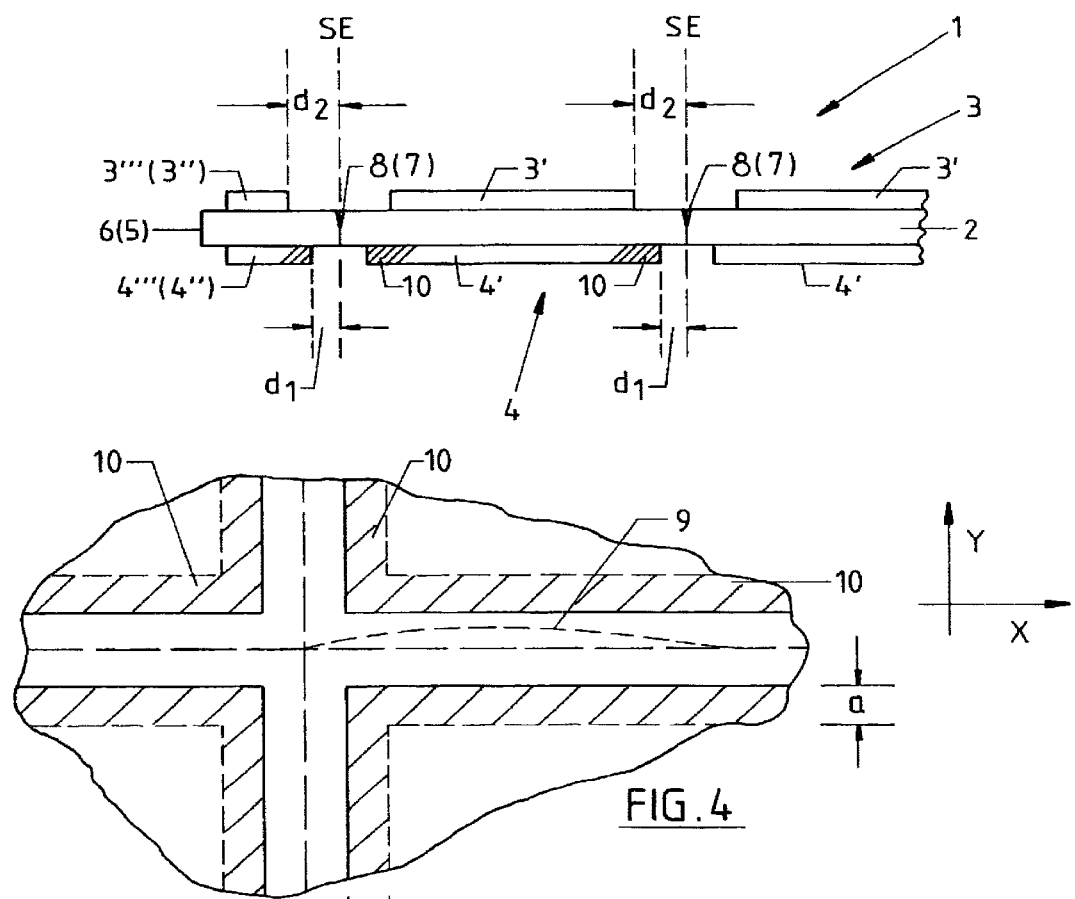

FIG. 10
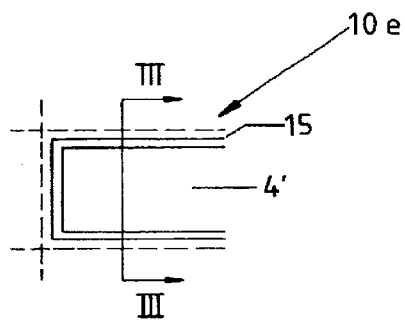
FIG. 11
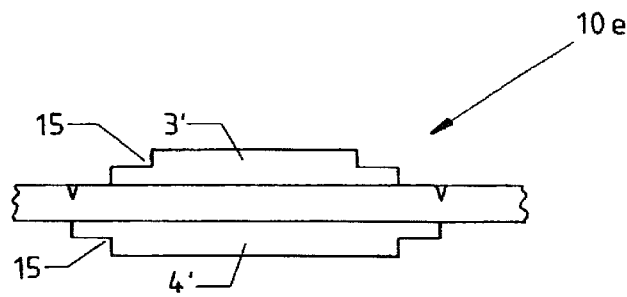
FIG. 12
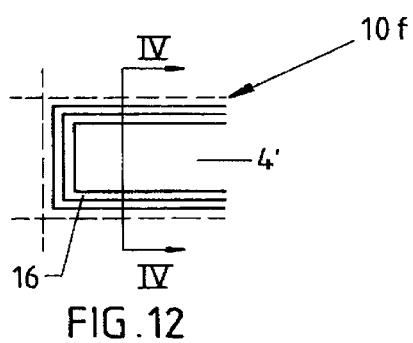
FIG. 13
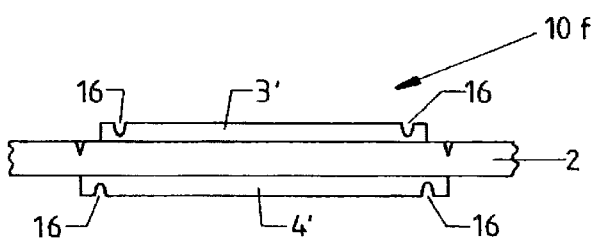
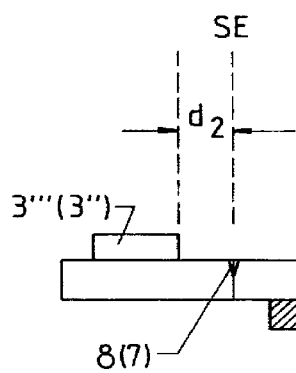
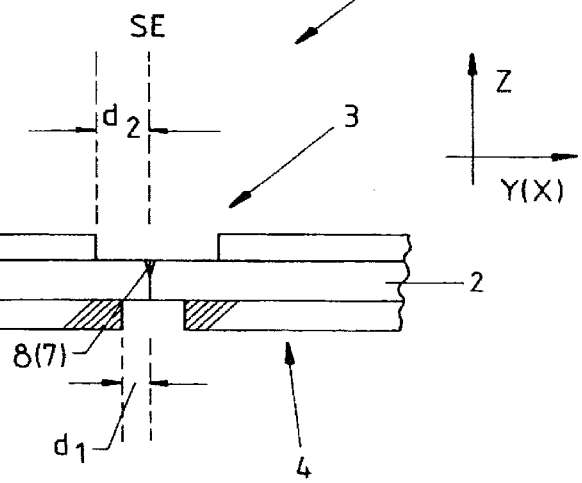
FIG. 15

US 6,638,592 B1

CERAMIC/METAL SUBSTRATE, ESPECIALLY COMPOSITE SUBSTRATE

BACKGROUND OF THE INVENTION

The invention pertains to a ceramic/metal substrate.

Ceramic/metal substrates are known, especially ceramic/copper substrates. These substrates are used for the manufacture of electric or electronic circuits, especially electric or electronic power circuits, and form the "printed boards" for these.

In the simplest case, such substrates have a ceramic layer that is provided with metalization on both surfaces, of which for example the metalization on the top of the ceramic layer is textured or structured in such a way, for example by using an etching process. The metalization then forms the conductors, contact surfaces etc. required for the switching circuit.

For the efficient production of electric or electronic circuits, a composite or multiple substrate (DE-PS 43 19 944) is known, in which at least two single substrates that are connected to each other as one piece are integrally formed on a large-format ceramic plate or layer. They are provided with at least one metal surface on at least one surface of the ceramic layer and connect by means of at least one predetermined break line in the ceramic layer. The separation of the composite substrate into the single substrates takes place on these predetermined break lines after applying of the electric or electronic components, by means of breaking. The disadvantage of this is that—due to internal tensions in the ceramic/metal substrate that result from the temperatures arising when applying the metalization sand due to the different thermal expansion coefficients of ceramic and metal—uncontrolled fractures, separation or breakage can occur. Although such uncontrolled breaks occur in only 1 to 5% of all cases, the resulting loss of production and damage is not inconsiderable, especially when the separation into the single substrates does not take place until after assembly.

The application of the metalization takes place in a heat process, i.e., in a process using considerable temperatures. Thus it is known, for example, that the metalization required for electric conductors, connections etc. on ceramic, e.g. on aluminum-oxide ceramic is produced by means of the so-called "DCB process" (direct copper bond technology), using metal or copper foils or metal or copper sheets forming the metalization that have a layer or a coating (melt-on layer) consisting of a chemical compound of the metal and a reactive gas, preferably oxygen. In this process, which is described for example in U.S. Pat. No. 37,44,120 or DE-PS 23 19 854, this layer or coating (melt-on layer) forms an eutectic system with a melting temperature under the melting temperature of the metal (e.g. copper), so that by application of the foil on the ceramic and by heating all layers these can be connected to each other, by melting on the metal or copper in the area of the melt-on layer or oxide layer.

This DCB technology then has the following processing stages:

Oxidation of a copper foil in such a manner that an even copper oxide layer is formed;
Application of the copper foil to the ceramic layer;
Heating of the compound to a processing temperature between approximately 1065 and 1083° C., e.g. to approx. 1071° C.;
Cooling to room temperature.

The object of the invention is to avoid this disadvantage.

SUMMARY OF THE INVENTION

Surprisingly, random or controlled breaks can be reduced considerably (proven up to 75%) when separating the ceramic/metal substrate with the embodiment according to the present invention.

BRIEF DESCRIPTION OF THE FIGURES

The invention is described in more detail using example embodiments in the following figures, wherein:

FIG. 3 shows a section corresponding to the line I—I in FIG. 1;

FIG. 4 shows an enlarged partial representation of the rear view of the composition substrate in FIG. 1;

FIG. 5 shows a partial section through the composite substrate in a possible embodiment;

FIGS. 8, 9 and 10 each show an enlarged partial representation of a view of the bottom of the composite substrate in a further embodiment;

FIG. 11 shows a section corresponding to the line III—III in FIG. 10;

FIG. 12 shows a representation similar to FIG. 6 of a further possible embodiment;

FIG. 13 shows a section corresponding to the line IV—IV of FIG. 12;

FIG. 15 shows a section through the composite substrate of FIG. 14 corresponding to the line V—V of FIG. 14;

DETAILED DESCRIPTION OF THE INVENTION

For the sake of simplicity, three perpendicular spatial axes (X-axis, Y-axis and Z-axis) are indicated in the FIGS. 1–13, of which the X- and Y-axes define the plane of the respective composite substrate (X-Y plane) and the Z-axis lies in the direction of the thickness of the respective composite substrate.

Figure 1:
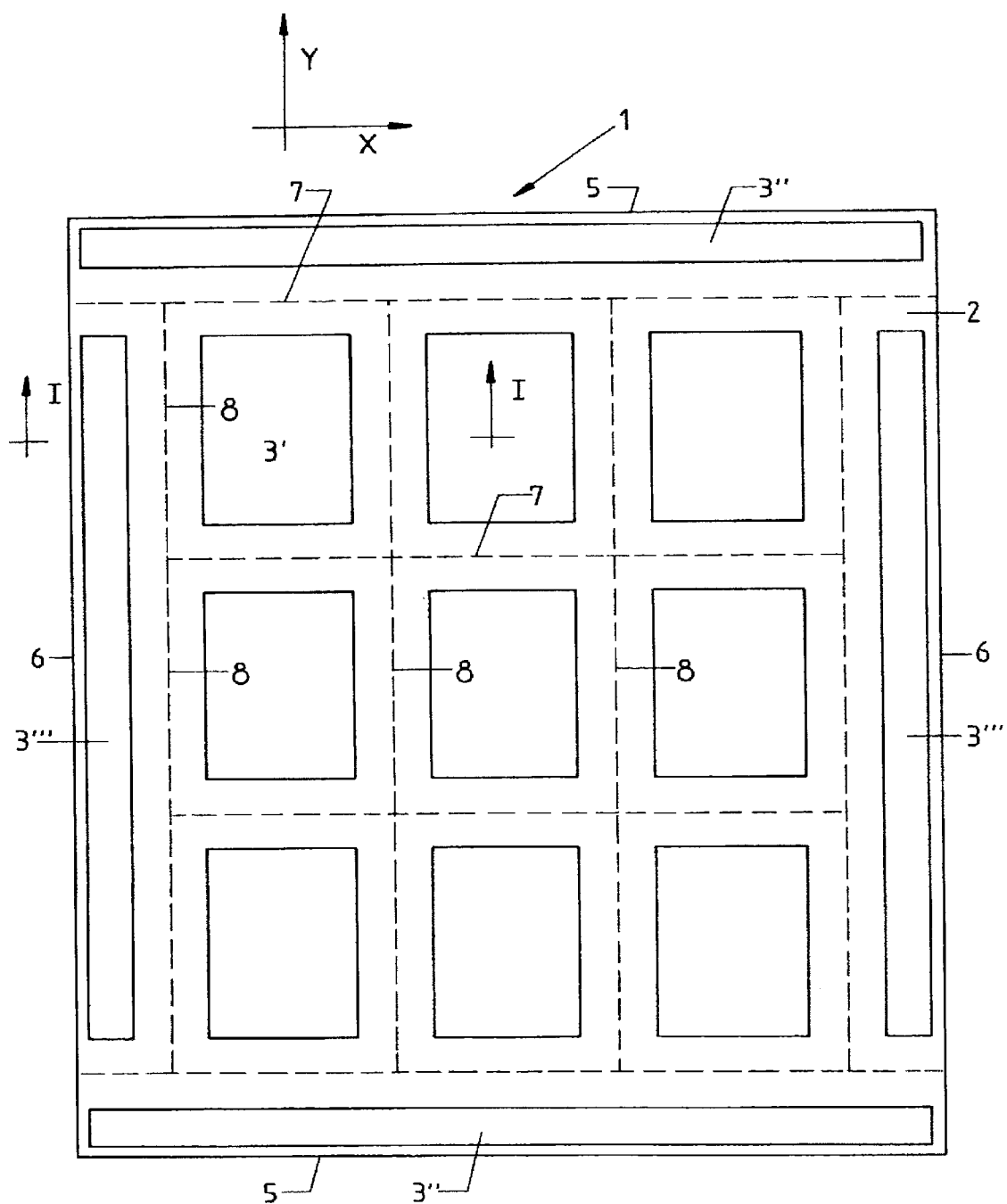
FIG. 1 shows a simplified representation in top view of a ceramic/metal substrate in the form of a composite substrate according to the present invention in unassembled condition.
Figure 2:
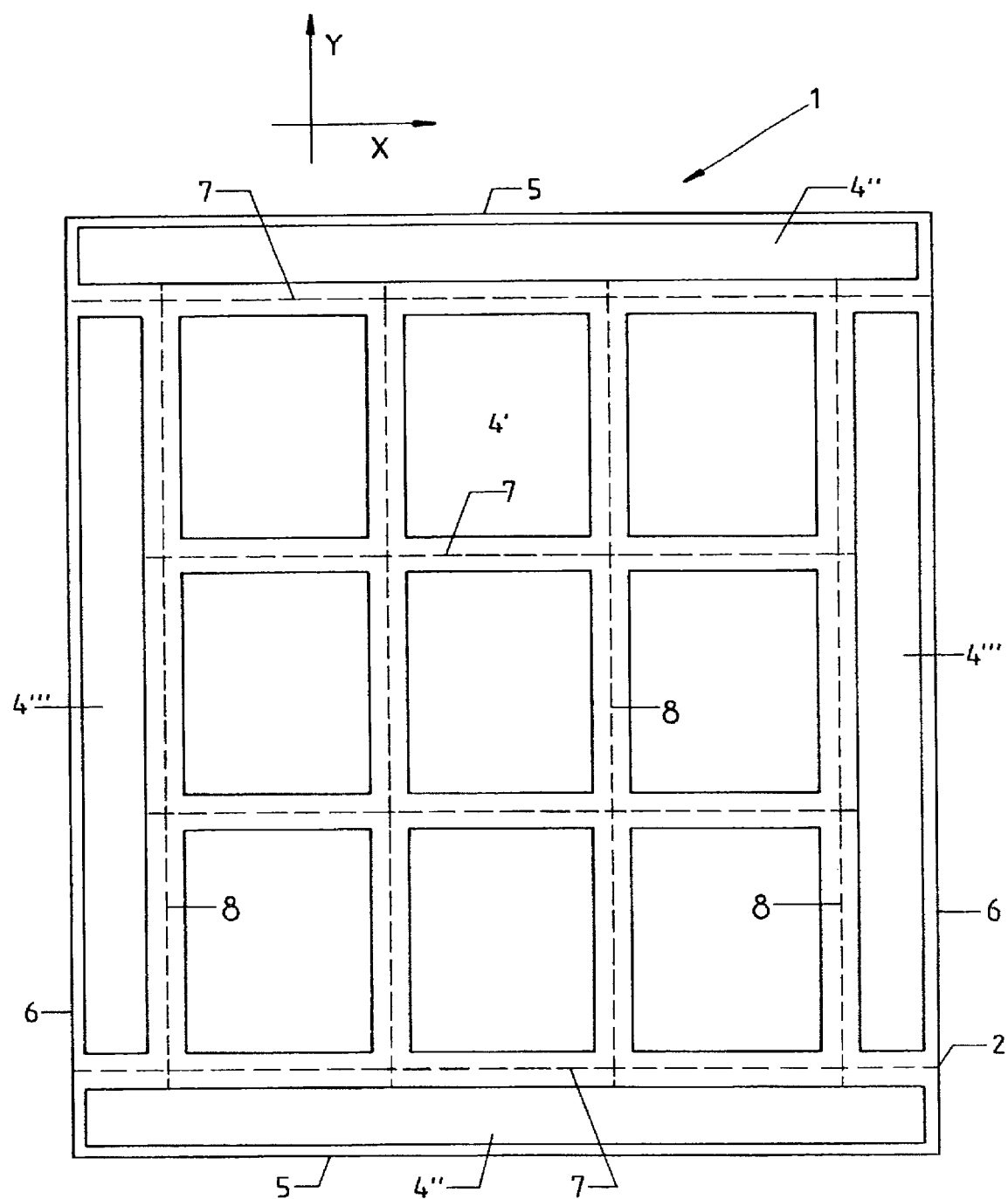
FIG. 2 shows a simplified representation in bottom view of the composite substrate in FIG. 1.

The composite substrate depicted in FIGS. 1–4 and generally referred to as 1 consists essentially of a ceramic plate or ceramic layer 2 that is, for example, aluminum nitride ceramic, or aluminum oxide ceramic, and in the embodiments of FIGS. 1–3 is provided with a textured metalization on both surfaces, on the top with the metalization 3 and on the bottom with the metalization 4. The metalizations are achieved in the depicted embodiments by applying a metal foil, e.g. a copper foil to each surface of the ceramic layer 2 by means of the DCB technology. The texture or structuring of the metalizations 3 and 4 is effected with the usual means known to the trade, for example, by means of masking and etching processes.

For the composite substrate 1, the metalization 3 on the top is textured in such a way that it forms several metal surfaces 3' that are provided for in several rows extending the direction of the X-axis and connecting with each other in the direction of the Y-axis.

The composite substrate 1, in the depicted embodiments, is formed with a rectangular circumference, in such a way that the shorter sides extend in the direction of the X-axis and the longer sides extend in the direction of the Y-axis.

Furthermore, the metalization 3 is textured in such a way that it forms on the edges 5 and 6 rectangular or striated metal surfaces 3" (along the edges 5) and 3'" (along the edges 6), whereby the two metal surfaces 3" both extend along the entire width (distance of the two edges 6) of the composite substrate 1 and the two metal surfaces 3" end with both ends in the vicinity of a metal surface (3"), respectively.

The metal surfaces 3' lie with their edges parallel to the edges 5 and 6 and thus also in the X-axis or Y-axis. Also the striated or elongated rectangular metal surfaces 3" and 3'" lie with their edges parallel to the edges 5 and 6 and thus in the direction of the X-axis or Y-axis.

All metal surfaces 3', 3", 3'" are at a distance from an adjacent metal surface, respectively, as described in more detail below. In the free areas of the ceramic layer 2 between the metal surfaces 3', 3" and 3'" , grooves forming predetermined break lines 7 and 8 are effected in such a way that these predetermined break lines extend not only between the individual metal surfaces 3' forming the single substrates, but also between the metal surfaces 3" and adjacent metal surfaces 3' and 3'" as well as between the metal surfaces 3'" and adjacent metal surfaces 3'. In particular, the predetermined break line 7 extends in the direction of the X-axis and the predetermined break line 8 in the direction of the Y-axis, whereby an outer predetermined break line 7 that is adjacent to the metal surface 3" extends across the entire width of the composite substrate 1 in the depicted-embodiment, i.e. also in the free areas of the top surface of the ceramic layer 2 between the metalizations 3" and 3'". The two outer predetermined break lines 8 both extend between the respective metal surface 3'" and the adjacent metal surfaces 3' and end in the depicted embodiment at the metal surfaces 3" or at the outer predetermined break lines 7 extending parallel to these metal surfaces.

The metalization 4 on the bottom side of the composite substrate 1 is textured in such a way that this metalization forms a number of metal surfaces 4' that correspond to the metal surfaces 3' and of which one metal surface 4' is directly adjacent to a metal surface 3', respectively. Also the metal surfaces 4' are, in the same manner as the metal surfaces 3', arranged in several rows and lie with their edges parallel to the edges 5 and 6. Furthermore, the metalization 4 forms metal surfaces 4" and 4'" that correspond to the metal surfaces 3" and 3'" and of which each metal surface 4" and 4'" lies adjacent to a metal surface 3" and 3'", respectively. The metal surfaces 4', 4" and 4'" are at a distance from each other at the predetermined break lines 7 and 8, so that the bottom of the ceramic layer 2 there is free.

Along the predetermined break lines 7 and 8 the composite substrate, especially after texturing of the metal surfaces 3' and after assembly, can be separated into single substrates or into electric components formed by said substrates by breaking along the predetermined break lines 7 and 8, whereby an opening of the composite substrate 1 is first necessary, wherein the edges provided with the metal surfaces 3" and 3'" and 4" and 4'" are broken off, along the outer predetermined break lines 7 or 8. This opening is possible only in a certain sequence, wherein first the outer edges possessing the metal surfaces 3" and 4" and then the outer edges possessing the metal surfaces 3'" and 4'" are broken off. By means of the metal surfaces 3", 4" and 3'", 4'", which bridge especially the predetermined break line 7 and 8 extending between the metal surfaces 3', unintentional breakage of the composite substrate 1 is effectively prevented.

FIG. 3 shows a partial cross-section through the composite substrate of FIG. 1. SE in this figure designates the planes extending perpendicular to the XY plane that enclose the predetermined break lines 7 or 8. As depicted in FIG. 3, all metal surfaces 4' of these middle planes SE have a distance d1. The edges of all metal surfaces 3', 3" and 3'" have a distance of d2 from the adjacent plane SE extending parallel to the respective edge. This applies both for the planes SE that are parallel to the XZ plane and parallel to the YZ plane.

In the depicted embodiment the thickness of the metalization 3 and 4 is, for example, 0.15–1.0 mm. Moreover, for the composite substrate 1, the respective distance d2 is greater or equal to d1, whereby d1, for example, is on the order of 1.0 to 0.05 mm. For the composite substrate 1 the distances d2 are greater than 1 mm.

The predetermined break lines 7 and 8 are produced, for example, by laser processing, e.g. by laser etching. The predetermined break lines 7 and 8 can, however, also be produced by some other means, e.g. by means of mechanical processing.

Due to the high processing temperatures and the differing heat expansion coefficients of the ceramic material and of the metal of the metalizations during the application of the metalizations 3 and 4 to the ceramic layer 2, mechanical tensions occur in the substrate that are then partially resolved during the texturing of the metalizations 3 and 4 or during the texturing of the metal surfaces 3', whereby residual mechanical tensions remain in the composite substrate, the orientation and size of which cannot be controlled.

In separating the composite or multiple substrate into single substrates by breaking along the predetermined break lines 7 and 8, it can therefore occur that in unfavorable cases a partial residual tension in the composite substrate is added to the forces or tensions arising during breaking in such a way that the breakage does not take place in the desired manner along the respective predetermined break line 7 or 8, but along a deviating random break line, indicated in FIG. 4 by the broken line 9.

Especially when the separation of the composite substrate does not take place until after the addition of components, such uncontrolled breaks 9 can cause considerable damage, since the respective single substrates are then no longer usable. The damage in this case is not limited to the costs of the single substrate, but also includes the labor and machine costs for assembly and the costs of the components that have been assembled on such a defective single substrate. As a rule of thumb, the value of an assembled single substrate is approximately 10 times that of an unassembled single substrate.

In order to avoid such uncontrolled breaks 9, while keeping the distances d1 as small as possible, so that the metal surface 4' provided for on the bottom of the respective single substrate extends as nearly as possible to the edge of this single substrate, as generally required for various reasons, the metal surfaces 4' on the bottom side are provided with a reduction along their edges (edge reduction), generally designated by 10 in FIG. 3.

This edge reduction 10 can, as described in more detail below, be achieved in a variety of ways, but is in any case formed in such a way that in the area of this edge reduction 10 the metal volume or the metal mass per volume unit is reduced. The width of the edge reduction is designated by a in FIG. 4 and is, for example, on the order of 0.2 to 6 mm. The reduction of the metal mass or the metal volume is such that the metal mass on the edge reduction 10 is only about 10 to 80% of the metal mass of a metal surface 4' without edge reduction, with reference to a specific volume unit. The edge reduction 10 is also provided for on the metal surfaces 4" and 4''', along the edges adjacent to the predetermined break lines 7 and 8, i.e. along the planes SE.

It has been shown that it is possible by means of this edge reduction 10 to provide the metal surfaces 4' with the small distance d1 from the planes SE while still strongly reducing uncontrolled breaks 9, so that altogether a reduction of refuse of up to 75% is possible as compared with conventional methods. Edge reductions on the metal surfaces 3', 3" and 3''' corresponding to the edge reductions 10 are then necessary or at least desirable, if the distances d2 are smaller than 1 mm.

FIGS. 6–15 show examples of various possibilities for forming the edge reduction 10. FIG. 5 depicts an edge reduction 10a that is formed by beveling of the edges of the metal surfaces 4', 4", 4''' adjacent to the planes SE, whereby the diagonal edge surface 11 formed here is in an angle á that is smaller than 45°.

Figure 6:
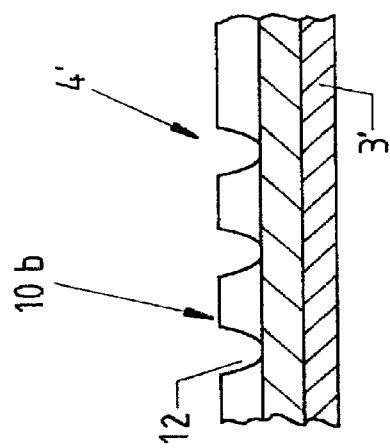
FIG. 6 shows an enlarged partial representation of a view of the bottom of the composite substrate in FIG. 1 in the area of a single substrate in a further possible embodiment.
Figure 7:
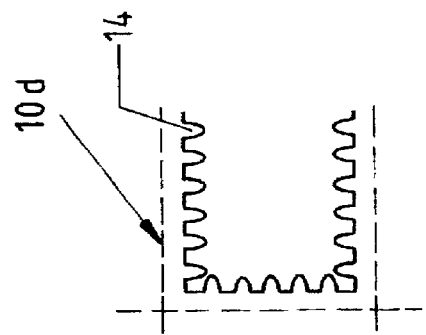
FIG. 7 shows a partial section corresponding to the line II—II in FIG. 6.

FIGS. 6 and 7 show an edge reduction 10b wherein rows of hole-like depressions 12 are formed along the edges of the metal surfaces 4', 4", 4''' adjacent to the planes SE, whereby these depressions 12 extend to the bottom side of the ceramic layer 2 and have a diameter, for example, of approximately 0.4 to 0.5 mm. The depressions 12 form a simple row of holes in this embodiment. In a possible embodiment, the depressions 12 have a diameter of approximately 0.5 mm. The width a of the edge reduction 10b, within which (width) also the depressions 12 are located, is, for example 0.8 mm, with a distance d1 of approximately 0.5 mm. The width a is hereby defined such that a is the maximum distance that the edges of the depressions 12 have from the adjacent edge of the metalization.

Figure 8:
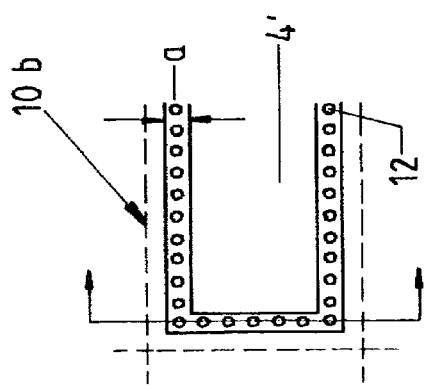

FIG. 8 shows a possible embodiment in which the edge reduction 10c is formed by the outer depressions 12, i.e. directly adjacent to the edges of the respective metalization 4', 4", 4''' and additional inner depressions 13. The latter are offset in relation to the depressions 12 and form, in addition to the outer row of holes (depressions 12) an inner row of holes (depressions 13), whereby both the depressions 12 and the depressions 13 extend to the bottom side of the ceramic layer 2. The diameter of the depressions 13 in this embodiment is smaller than the diameter of the depressions 12. For example, the width a of the edge reduction 10c, within which (width a) all depressions 12 and 13 are located, is approximately 1.4 mm, whereby the diameter of the outer depressions is approximately 0.6 mm and that of the inner depressions approximately 0.4 mm. The width a is hereby defined such that a is the maximum distance that edges of the depressions 13 have from the adjacent edge of the metalization.

Figure 9:
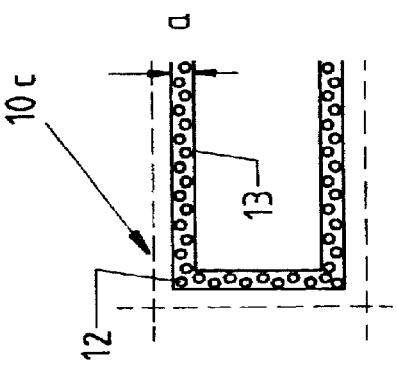

FIG. 9 shows as a further possibility for an edge reduction 10d wherein the edges of the metal surfaces 4', 4" and 4''' adjacent to the planes SE are provided with depressions 14 that are open toward these edges, resulting in meandering edges. The depressions 14 extend likewise to the bottom side of the ceramic layer 2.

In general, with respect to the edge reductions 10b–10d it is also possible to design all or only some of the depressions 12, 13 or 14 such that they do not extend to the bottom side of the ceramic layer 2, but rather a remainder of the metalization 4 forms the bottom of the respective depression.

FIGS. 10 and 11 show as a further possibility an edge reduction 10e that is formed by a graduation 15 of the edges of the metal surfaces 4', 4", 4''' adjacent to the planes SE, i.e. within the width a of the edge reduction 10e the thickness of the material of the respective metal surface increases in steps, for example in the embodiment of FIGS. 9 and 10 in one step. In general, several steps 15 can also be provided for.

FIGS. 11 and 12 show as a further possible embodiment an edge reduction 10f wherein the metal surfaces 4', 4" and 4''' are each provided with a groove-like depression 16 that extends along the edges of the metal surfaces extending along the planes SE and adjacent to these planes, whereby the depression 16 on the metal surfaces 4' is designed as a self-contained groove.

In order to demonstrate that, for smaller distances d2, it is at least desirable to provide also the metal surfaces 3', 3" and 3''' on the top side of the composite substrate 1 with a corresponding edge reduction, edge reductions 10e and 10f are depicted also for the metal surfaces 3', 3" and 3''' in FIGS. 10–13.

Of course, the individual edge reductions 10a–10f can also be combined, for example on one side of the composite substrate 1, respectively, or on several sides. Furthermore, edge reductions 10 are provided for only where corresponding metal surfaces 3', 3", 3''' or 4', 4", 4''' are provided for.

Figure 14:
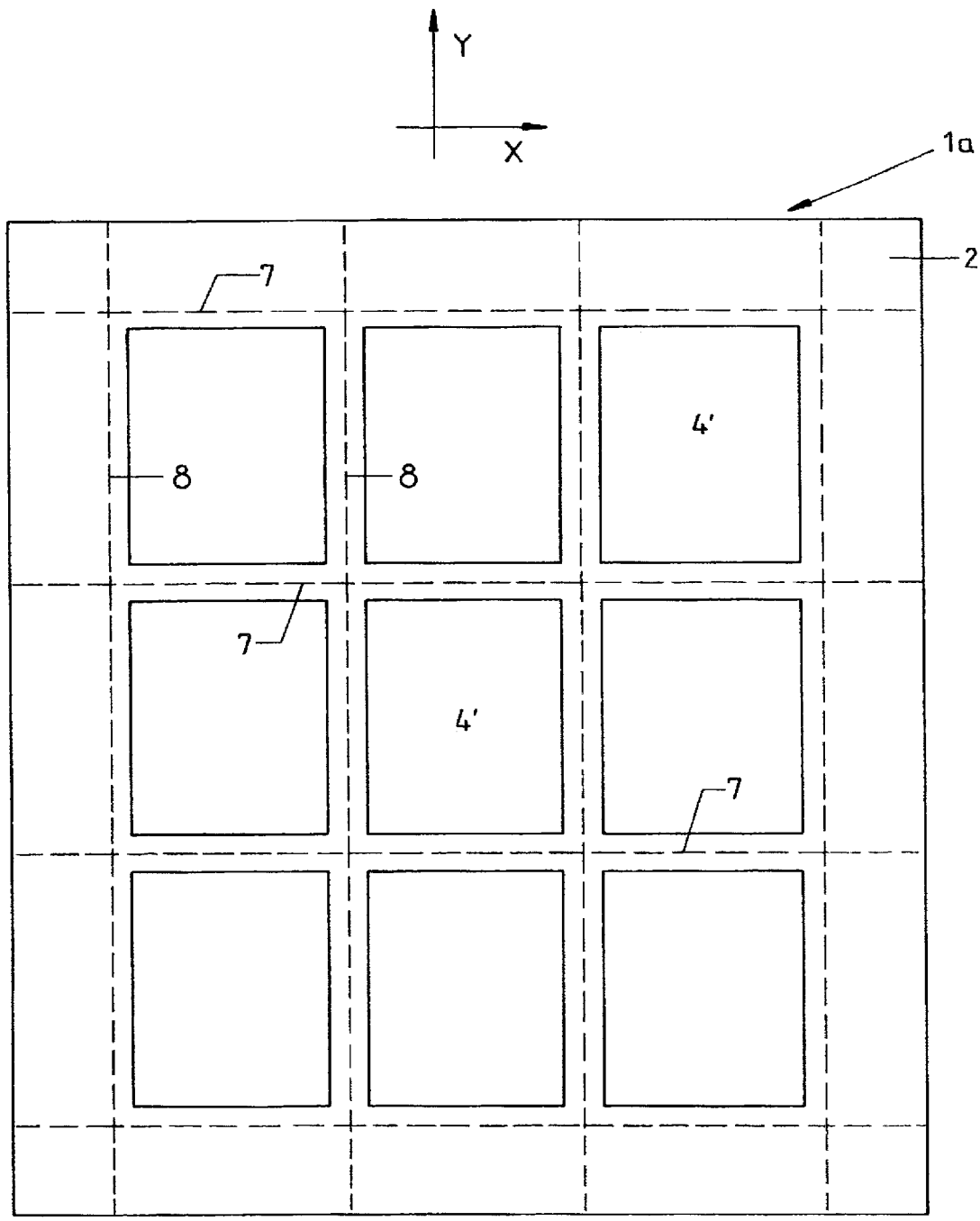
FIG. 14 shows a simplified representation of a bottom view of a composite substrate of a further embodiment of the invention.

FIGS. 14 and 15 show as a further possible embodiment similar to FIGS. 1 and 3 a composite substrate 1a that differs essentially from the composite substrate 1 only in that the metal surfaces 4" and 4''' provided for on the edges 5 and 6 are not present, but only the metal surfaces 3" and 3''' on the top side of the composite substrate.

Figure 16:
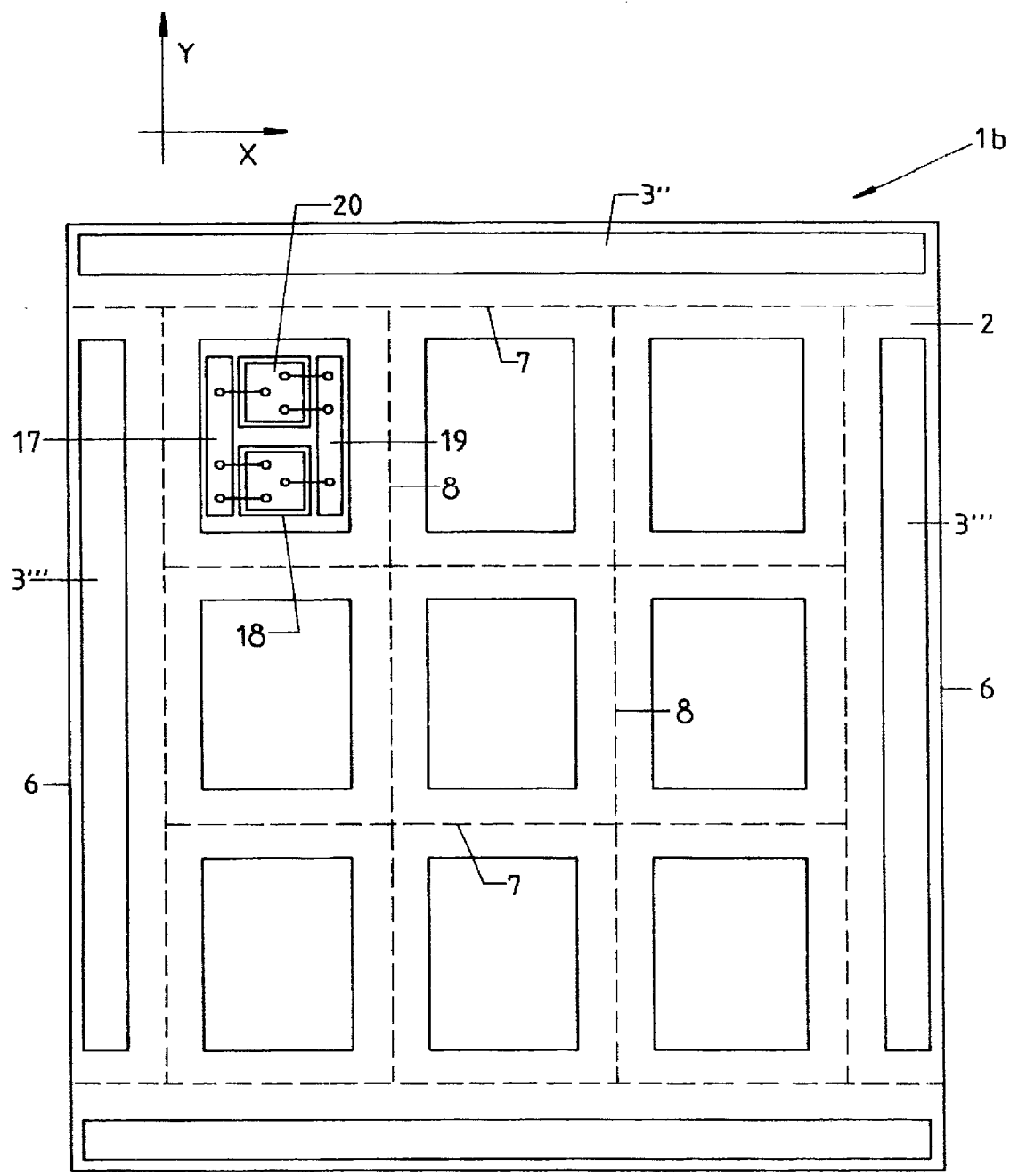
FIG. 16 shows a top view of an assembled composite substrate.

FIG. 16 shows a composite substrate 1b that corresponds, for example, to the composite substrate 1 or 1a, but in which the metal surfaces 3' provided for on the top side for the formation of conductors, contact surfaces etc. are textured for the single substrates as schematically depicted in this figure by the numbers 17, 18 and 19. On the textured surface areas 18, components in the form of semiconductor chips 20 are attached that are electrically connected by means of wire bonds to the corresponding textured areas 17 and 18 forming the electric contact surfaces or connections. Although only depicted for a single substrate or one metal surface 3', all metal surfaces 3' are textured in this manner and assembled with components, so that a large card or a composite printed board or an assembled composite substrate is produced that is not separated into single substrates or into the individual components or switching circuits until after assembly.

In the above sample embodiments an edge reduction 10 was provided for on the metal surfaces 4', 4" or 4''' (of course, only insofar as these metal surfaces exist) and if applicable also on the metal surfaces 3', 3" and 3''' along all edges adjacent to a plane SE.

Figure 17:
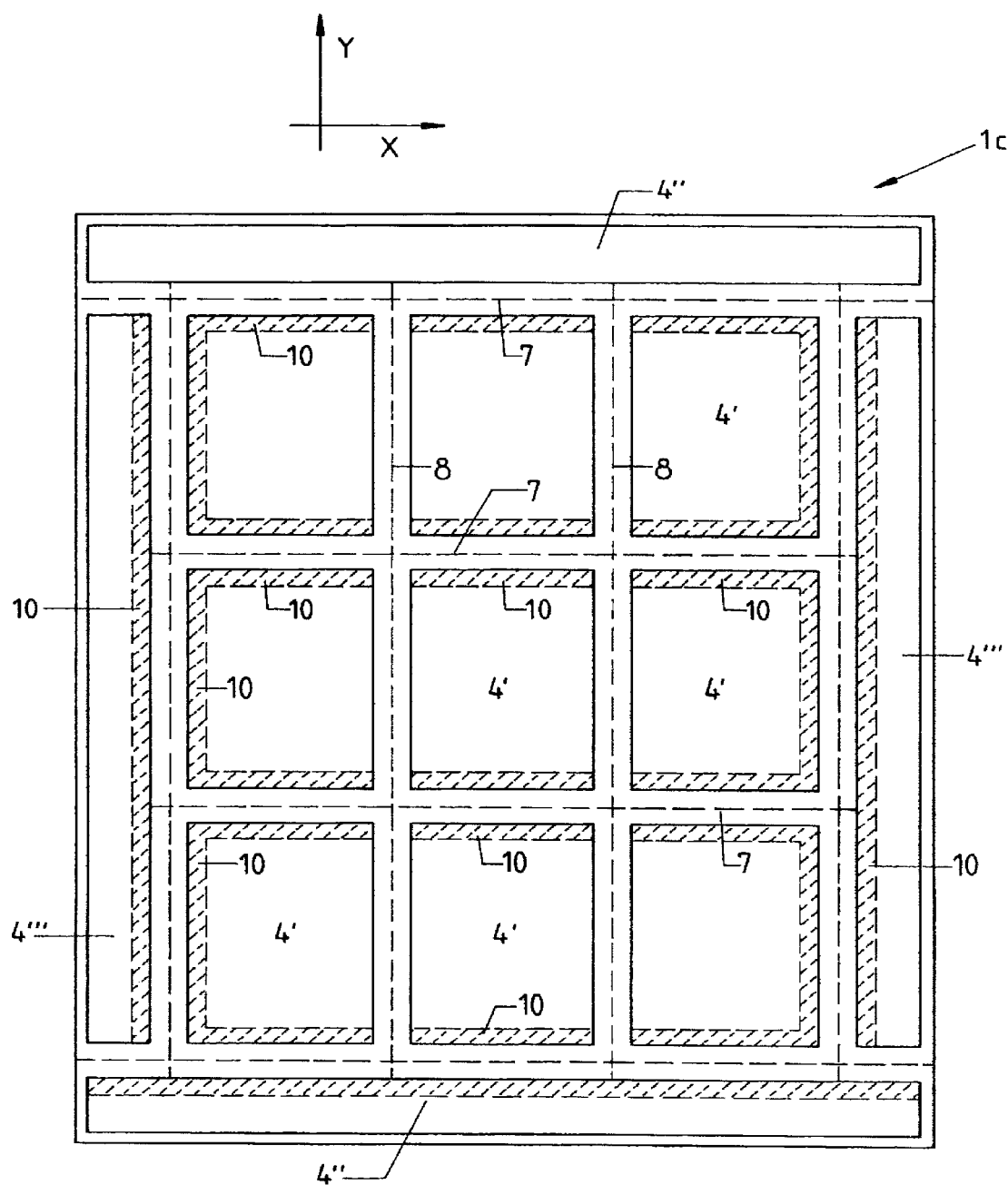
FIG. 17 shows a further possible embodiment in a representation similar to FIG. 2.

FIG. 17 shows in a depiction similar to FIG. 2 as a further possibility a composite substrate 1c in which edge reductions 10 are provided for only along part of the edges of the metal surfaces 4', 4" or 4'" and if applicable also only on part of the edges of the metal surfaces 3', 3" and 3'", again of course only if the respective metal surfaces actually exist.

The embodiment depicted in FIG. 17 is based on the knowledge that random breaks 9 tend to occur when, during separation or breaking of the composite substrate into single substrates, the breakage takes place along a predetermined break line 7 or 8 that extends across several single substrates. For example, if the separation of the composite substrate 1c takes place according to the rule or breaking sequence indicated below, then an edge reduction 10 is not necessary on those edges of the metal surfaces 3' that are adjacent to the predetermined break lines 8 extending between these metal surfaces 3' or the planes SE that enclose the predetermined break line 8 extending between the metal surfaces 4'. The same holds true for the metal surfaces 3', insofar as an edge reduction is necessary or desirable on these.

In FIG. 17 the edges of the metal surfaces 4', 4", 4'" that are provided with an edge reduction 10 are also cross-hatched. The edges that do not have an edge reduction 10 are depicted as a straight line. As can also be seen in FIG. 17, the metal surfaces 4' are not provided with the edge reduction 10 on an edge that is adjacent to a group of predetermined break lines extending between these metal surfaces, namely the predetermined break lines 8 extending in the Y-axis, but on all other edge areas.

The opening of the composite substrate 1c and breaking of this substrate into single substrates then takes place in the following sequence:

1. Breaking of the edges possessing the metal surfaces 3" or 4";
2. Breaking of the edges possessing the metal surfaces 3'" or 4'";
3. Successive breaking of the rows or strips in this embodiment, each possessing three single substrates, and extending in the X-axis along the predetermined break lines 7, for example beginning from the upper edge of the composite substrate 1c in FIG. 17.
4. Breaking of the single strips produced in this way, each with three single substrates, along the very short remaining predetermined break line 8 in the single strips, into single substrates.

Since the breaking of the strips into single substrates in accordance with number 4 above takes place on predetermined break lines 8, the remaining length of which corresponds to the width of a single substrate, random breaks 9 are less likely here, so that an edge reduction 10 is not necessary along the predetermined break lines 8 extending between the metal surfaces 3' or 4'.

In general, it is also possible to change the breaking sequence, i.e. after breaking off the outer edges possessing the metal surfaces 3" or 4" and 4'" or 4'" to first produce strips of single substrates by breaking along the predetermined break lines 8 and then to break these along the predetermined break lines 7. With this breaking sequence edge reductions 10 are in any case also necessary along the predetermined break lines 8 extending between the single substrates, while edge reductions along the predetermined break lines 7 extending between the single substrates are not necessary.

It is, however, generally true that the breaking should always take place on predetermined break lines that are as short as possible, i.e. in a rectangular embodiment of the composite substrate with the longer side in the direction of the Y-axis and the shorter side in the X-axis, the breaking into strips necessarily takes place along the shorter predetermined break lines 8.

The invention was described above using sample embodiments. Of course, numerous alternations and adaptations are possible without abandoning the underlying inventive idea of the invention.

| List of reference symbols | |
|---|---|
| 1, 1a, 1b, 1c | composite substrate |
| 2 | ceramic layer |
| 3, 4 | Metalization |
| 3', 3'', 3''' | metal surface |
| 4', 4'', 4''' | metal surface |
| 5, 6 | Edge |
| 7, 8 | predetermined break line |
| 9 | random break line |
| 10, 10a, 10b, 10c, 10d, 10e, 10f | edge reduction |
| 11 | beveling or diagonal edge surface |
| 12, 13, 14 | Depression |
| 15 | Graduation |
| 16 | Depression |
| 17, 18, 19 | textured metal surface |
| 20 | Component |

What is claimed is:

1. A ceramic/metal substrate, comprising
   a ceramic layer forming at least two substrate areas connected to each other as one piece and joined to each other on at least one predetermined break line provided for in the ceramic layer, metal surfaces on at least one side of the ceramic layer, said metal surfaces being provided on said substrate areas such, that the metal surfaces on neighbored substrate areas are at a distance from the predetermined break line and from one another along said at least one breaking line,
   said metal surfaces being formed by a metalization which had been bonded to the ceramic layer by a heat process elected from the group consisting of direct bonding or active soldering and by structuring the metalization after bonding,
   that at least one metal surface of each substrate areas has an edge reduction on an edge region adjacent to the predetermined break line and running along this predetermined break line, the edge reduction being of a form that the mass of metal there per volume (specific metal mass) is reduced 10–80% along the edge region with reference to the specific metal mass of metal surface outside the edge reduction.

2. The ceramic/metal substrate according to claim 1, wherein at least one of the substrate areas comprise single substrates.

3. The ceramic/metal substrate according to claim 1, wherein the width of the edge reduction or of the reduced metal mass area is approximately 0.2 to 6 mm.

4. The ceramic/metal substrate according to claim 1, wherein at least one outer metal surface that is provided for on at least one surface of the ceramic layer at least along one edge of the ceramic/metal substrate, and by at least one predetermined break line between the at least one outer metal surface and adjacent substrate areas, whereby the at least one outer metal surface has an edge reduction along the predetermined break line.

5. The ceramic/metal substrate according to claim 1, wherein an edge having the edge reduction has a distance from the adjacent predetermined break line or a plane of the predetermined break line that is considerably less than 1 mm.

6. A The ceramic/metal substrate according to claim 1, wherein edges with the edge reduction have a distance from the respective predetermined break line of approximately 0.05 to 1 mm.

7. The ceramic/metal substrate according to claim 1, wherein the textured or structured metalizations, or metal surfaces formed by these, have a thickness of between approximately 0.15 to 1 mm.

8. The ceramic/metal substrate according to claim 1, wherein the edge reduction is formed by beveling of the respective edge, the beveling forms an angle smaller than 45° with a plane of the ceramic layer.

9. The ceramic/metal substrate according to claim 1, wherein the edge reduction is formed by hollows or depressions in a material of the metal surface.

10. The ceramic/metal substrate according to claim 9, wherein the hollows or depressions are formed continuously, and extend to a surface side of the ceramic layer adjacent to the metal surface.

11. The ceramic/metal substrate according to claim 9, wherein the hollows or depressions are formed in such a way that metal from the metal surface remains on the surface side of the ceramic layer adjacent to the metal surface.

12. The ceramic/metal substrate according to claim 1, wherein the edge reduction is formed by a number of hole-like depressions that are arranged as a row of holes.

13. The ceramic/metal substrate according to claim 12, wherein outer and inner depressions form an outer and a second inner row of holes.

14. The ceramic/metal substrate according to claim 12, wherein the depressions have a diameter of approximately 0.5 to 0.6 mm.

15. The ceramic/metal substrate according to claim 12, wherein the depressions forming a single row of holes have a diameter of 0.5 mm, with a width of the edge reduction of approximately 0.8 mm and with a distance of the edge from the predetermined break line of approximately 0.5 mm.

16. The ceramic/metal substrate according to claim 12, wherein the several rows of holes of the outer row of holes have a diameter that is larger than a diameter of the depressions of the inner row of holes, whereby the diameter of the depressions of the outer row of holes is approximately 0.6 mm and the diameter of the depressions of the inner row of holes is approximately 0.4 mm and the width of the edge reduction is approximately 1.4 mm.

17. The ceramic/metal substrate according to claim 1, wherein the edge reduction is formed by a groove-shaped depression.

18. The ceramic/metal substrate according to claim 1, wherein the edge reduction is formed by a graduation in at least one partial area.

19. The ceramic/metal substrate according to claim 2, wherein at least in an area of the single substrate on both surfaces of the ceramic layer at least one metal surface is provided for and that the at least one metal surface has, on a first surface area, on a bottom of the ceramic/metal substrate, an edge distance from the adjacent predetermined break line or its plane which edge distance is smaller than the edge distance of the metal surfaces on the second surface area, on a top of the ceramic/metal substrate.

20. The ceramic/metal substrate according to claim 1, wherein with several substrate areas or single substrates arranged in several rows, two groups of crossing predetermined break lines are formed.

21. The ceramic/metal substrate according to claim 1, wherein on at least one surface area of the ceramic/metal substrate, all edges of the metal surfaces adjacent to a predetermined break line are provided with edge reduction.

22. The ceramic/metal substrate according to claim 1, wherein the metal surfaces on at least one surface area of the ceramic layer has no edge reduction on edges that are adjacent to a group of predetermined break lines.

23. The ceramic/metal substrate according to claim 2, wherein the single substrates are not provided with components.

24. The ceramic/metal substrate according to claim 1, wherein the single substrates formed by substrate areas are provided with electric components.

25. A ceramic/metal substrate, comprising
a ceramic layer forming at least two substrate areas connected to each other as one piece and joined to each other on at least one predetermined break line provided for in the ceramic layer, metal surfaces on at least one side of the ceramic layer, said metal surfaces being provided on said substrate areas such, that the metal surfaces on neighbored substrate areas are at a distance from the predetermined break line and from one another along said at least one breaking line,
said metal surfaces being formed by a metalization which had been bonded to the ceramic layer by a heat process elected from the group consisting of direct bonding or active soldering and by structuring the metalization after bonding,
that at least one metal surface of each substrate areas has an edge reduction on an edge region adjacent to the predetermined break line and running along this predetermined break line, the edge reduction being of a form that the mass of metal there per volume (specific metal mass) is reduced 10–80% along the edge region with reference to the specific metal mass of metal surface outside the edge reduction,
said edge reduction being formed by depressions, hollows, grooves or steps in the material of the metal surface.

* * * * *